United States Patent
Char et al.

(10) Patent No.: US 8,847,201 B2
(45) Date of Patent: Sep. 30, 2014

(54) QUANTUM DOTS HAVING COMPOSITION GRADIENT SHELL STRUCTURE AND MANUFACTURING METHOD THEREOF

(75) Inventors: Kookheon Char, Seoul (KR); Seong Hoon Lee, Seoul (KR); Wan Ki Bae, Busan (KR); Hyuck Hur, Chungcheongnam-do (KR)

(73) Assignee: SNU R&DB Foundation, Seoul (KR)

( * ) Notice: Subject to any disclaimer, the term of this patent is extended or adjusted under 35 U.S.C. 154(b) by 138 days.

(21) Appl. No.: 13/589,821

(22) Filed: Aug. 20, 2012

(65) Prior Publication Data

US 2012/0315391 A1 Dec. 13, 2012

Related U.S. Application Data

(62) Division of application No. 12/442,943, filed as application No. PCT/KR2007/004662 on Sep. 21, 2007, now abandoned.

(30) Foreign Application Priority Data

Sep. 25, 2006 (KR) ........................ 10-2006-0093025

(51) Int. Cl.
| | |
|---|---|
| H01L 29/06 | (2006.01) |
| H01L 31/00 | (2006.01) |
| B82Y 10/00 | (2011.01) |
| C01B 19/00 | (2006.01) |
| B82Y 30/00 | (2011.01) |
| H01L 29/22 | (2006.01) |
| C09K 11/88 | (2006.01) |
| C01G 9/08 | (2006.01) |
| C09K 11/02 | (2006.01) |
| C09K 11/56 | (2006.01) |
| C01G 11/00 | (2006.01) |
| H01L 29/12 | (2006.01) |
| C01G 11/02 | (2006.01) |
| H01L 21/02 | (2006.01) |

(52) U.S. Cl.
CPC ............... *H01L 29/127* (2013.01); *B82Y 10/00* (2013.01); *C01P 2004/03* (2013.01); *H01L 21/0256* (2013.01); *H01L 21/02601* (2013.01); *C01B 19/002* (2013.01); *C01B 19/007* (2013.01); *B82Y 30/00* (2013.01); *H01L 29/22* (2013.01); *C09K 11/883* (2013.01); *C01P 2004/04* (2013.01); *C01G 9/08* (2013.01); *C01P 2006/40* (2013.01); *H01L 21/0248* (2013.01); *C09K 11/02* (2013.01); *C09K 11/565* (2013.01); *H01L 21/02562* (2013.01); *C01G 11/00* (2013.01); *C01G 11/02* (2013.01); *C01P 2004/84* (2013.01); *H01L 21/02477* (2013.01); *H01L 21/02557* (2013.01); *H01L 21/02474* (2013.01); *Y10S 438/962* (2013.01); *Y10S 977/774* (2013.01)
USPC ....... 257/14; 257/E29.071; 438/962; 977/774

(58) Field of Classification Search
CPC ............ B82Y 40/00; H01L 31/035209; H01L 31/035218; H01L 51/502
See application file for complete search history.

(56) References Cited

U.S. PATENT DOCUMENTS

| | | |
|---|---|---|
| 2001/0000336 A1 | 4/2001 | Kim et al. |
| 2003/0092227 A1 | 5/2003 | Lee et al. |
| 2005/0051766 A1 | 3/2005 | Stokes et al. |
| 2006/0057382 A1 * | 3/2006 | Treadway et al. ............ 428/403 |

FOREIGN PATENT DOCUMENTS

WO    WO 2006/065054    6/2006

* cited by examiner

*Primary Examiner* — Daniel Whalen
(74) *Attorney, Agent, or Firm* — Sherr & Jiang, PLLC

(57) ABSTRACT

Provided are quantum dots having a gradual composition gradient shell structure which have an improved luminous efficiency and optical stability, and a method of manufacturing the quantum dots in a short amount of time at low cost. In the method, the quantum dots can be manufactured in a short amount of time at low cost using a reactivity difference between semiconductor precursors, unlike in uneconomical and inefficient conventional methods where shells are formed after forming cores and performing cleaning and redispersion processes. Also, formation of the cores is followed by formation of shells having a composition gradient.

6 Claims, 5 Drawing Sheets

QUANTUM DOTS HAVING COMPOSITION GRADIENT SHELL STRUCTURE AND MANUFACTURING METHOD THEREOF

The present application is a Divisional Application of co-pending U.S. patent application Ser. No. 12/442,943 (filed on Feb. 1, 2010) under 35 U.S.C. §120, which is a National Stage Patent Application of PCT International Patent Application No. PCT/KR2007/004662 (filed on Sep. 21, 2007) under 35 U.S.C. §371, which claims priority to Korean Patent Application No. 10-2006-0093025 (filed on Sep. 25, 2006) under 35 U.S.C. §119, which are all hereby incorporated by reference in their entirety.

TECHNICAL FIELD

The present invention relates to quantum dots having a gradual composition gradient shell structure and a method of manufacturing the same, and more particularly, quantum dots which have improved luminous efficiency and optical stability owing to a gradual composition gradient shell structure, and a method of manufacturing the same.

BACKGROUND ART

Conventionally, quantum dots have been manufactured using a dry chemical process, specifically, by inducing lattice mismatch between a substrate prepared in a vacuum and a layer deposited using a metal organic chemical vapor deposition (MOCVD) process. In this case, although nanoparticles may be formed and arranged on the substrate, expensive equipments are required. And it is also difficult to produce large quantities of quantum dots with a uniform size through conventional semiconductor fabrication methods. In order to solve these problems, a wet chemical process for synthesizing quantum dots with a uniform size using a surface active agent (surfactant) has been developed.

A method of manufacturing quantum dots through a wet chemical process includes preventing nanoparticles from aggregating together using a surfactant and controlling the reactivity of crystal surfaces by moderate choices of surfactants to synthesize quantum dots with various shapes with an uniform size. In 1993, the Bawendi group succeeded in synthesizing cadmium selenide (CdSe) quantum dots with a uniform size by means of a wet chemical process using trioctylphosphineoxide (TOPO) and trioctylphosphine (TOP) as surfactants, dimethyicadmium $(Me)_2Cd$ and selenium as precursors of Group II and Group VI. Also, the Alivisatosgroup developed a method of synthesizing CdSe quantum dots in a safer manner using hexadecylamine (HDA), trioctylphosphineoxide, and trioctylphosphine as surfactants, cadmium oxide (CdO), and TOPSe as precursors of Group II and Group VI.

Subsequently, a substantial amount of research has been conducted to passivate the surfaces of CdSe quantum dots with compound semiconductor shaving a larger bandgap in order to improve luminous characteristics and optical and environmental stability of the CdSe quantum dots. For example, CdSe/ZnS (refer to J.Phys.Chem.B, 1997, 101, 9465-9475), CdSe/ZnSe (refer to Nano Letters, 2002, 2, 781-874), CdSe/CdS (refer to J. Am. Chem, Soc., 1997, 119, 7019-7029), and ZnSe/ZnS (Korean Patent Registration No. 10-0376403) have been proposed.

However, in conventional core-shell quantum dots, when a thick shell is formed, an interface between the core and shell of the quantum dot becomes unstable due to the lattice mismatch between a core semiconductor material and a shell semiconductor material, thereby causes formation of defects which lower quantum efficiency of quantum dots. Thus, the conventional core-shell quantum dots have thin shell structures. As a result, the shell semiconductor material functions only to stabilize the surface state of the core of the quantum dot and cannot funnel electrons and holes to the core. Therefore the conventional core-shell quantum dots have limitations in luminous efficiency, optical stability, and environmental stability.

Therefore, research into the manufacture of a multishell including an intermediate shell has been progressed in order to minimize lattice mismatch between core structure and shell structure of quantum dots. For example, CdSe/CdS/ZnS (Korean Patent Registration No. 10-2005-0074779) and CdSe/CdS/$Zn_{0.5}Cd_{0.5}S$/ZnS (refer to J. Am. Chem. Soc. 2005,127, 7480~7488) were proposed. Since the core-multishell quantum dots described above have high luminous efficiencies and sufficient optical and environmental stability, they can be applied to practical applications such as various emission materials, laser materials, and biological marker materials. However, the manufacture of conventional core-multishell quantum dots involves complicated synthetic processes. Specifically, after each synthetic steps (i.e., synthesis of cores or each intermediate shells of quantum-dot), the synthetic process should be ended, all surfactants and precursors should be cleaned away, and a precursor required for intermediate shells should be injected into a new surfactant at an appropriate temperature to react over a long period. Also, during the sequential purification steps, some quantum dots and nonreacted precursors are removed too, which is counterproductive. Furthermore, in quantum dots having a stacked shell structure obtained according to the synthesis process described above, only excitons generated in quantum-dot cores are used, while excitons generated in quantum-dot shells do not contribute to light emission, which limits luminous efficiency of quantum dots.

Accordingly, there is still room to develop highly crystalline quantum dots having high luminous efficiency and optical and environmental stability, and a straightforward technique for synthesizing the quantum dots in large quantities at low cost.

DISCLOSURE OF INVENTION

Technical Problem

The present invention is as to quantum dots of highly luminous efficiency and optical stability which is due to a gradual composition gradient shell structure, and this is a method of manufacturing the quantum dots in a short time at low cost.

Technical Solution

In their efforts to overcome the disadvantages of conventional quantum dots and methods of manufacturing them, the present inventors have developed a new method of economically manufacturing quantum dots having a gradual composition gradient shell structure through a single-step process using the reactivity difference between Group II metal-containing compounds and that between Group VI element-containing compounds. Also, the present inventors confirm that optically stable quantum dote of highly luminous efficiency can be manufactured by this method.

One aspect of the present invention provides aquantum dot including a Group II-VI compound core and a Group II-VI compound shell. A Group II-VI compound forming the shell has a larger bandgap than a Group II-VI compound forming the core and the Group II-VI compound shell has a gradual composition gradient.

Another aspect of the present invention provides a method of manufacturing quantum dots. The method includes the steps of: (1) mixing a Group II metal-containing compound forming a core with a Group II metal-containing compound forming a shell; (2) heating the mixture at a temperature of 100 to 350° C. (3) mixing the heated mixture with a Group VI element-containing compound forming the core and a Group VI element-containing compound forming the shell; and (4) forming the shell to have a composition gradient by maintaining the mixture of step (3) at a temperature of Still another aspect of the present invention provides a quantum dot including: a core; an outer shell having a predetermined bandgap energy higher than that of the core; and an inner shell surrounding the core and surrounded by the outer shell, the inner shell having a bandgap energy that gradually decreases from the outer shell toward the core.

Yet another aspect of the present invention provides a method of manufacturing quantum dots including the steps of: (a) reacting compounds to form cores; and (b) reacting remaining compounds to form shells having a gradual composition gradient, wherein step (a) and step (b) are sequentially performed due to a difference in reactivity between the compounds.

Still yet another aspect of the present invention provides a method of manufacturing quantum dots including the steps of: (a) forming cores; and (b) reacting compounds to form shells, wherein, in step (b), the shells are formed to have a gradual composition gradient due to a difference in reactivity between the compounds.

Advantageous Effects

According to the present invention, quantum dots can be manufactured in a short amount of time at low cost using a difference in reactivity between semiconductor precursors, unlike in uneconomical and inefficient conventional methods where shells are formed after forming cores through performing consecutive cleaning and re-dispersion processes. Also, according to the present invention, formation of cores is spontaneously followed by formation of shells having a composition gradient. Thus, even if shells are formed to a large thickness, the lattice mismatch between core and shell does not occur, unlike in conventional core-shell quantum dots. Furthermore, the funnel concept is applied to the present invention, so that electrons and holes absorbed in the shells are transferred to the cores to emit light, thereby a high luminous efficiency of 80% or higher is obtained. Moreover, the use of a surfactant can be minimized to facilitate a subsequent cleaning process, and the surfaces of synthesized quantum dots can be easily substituted, so that the quantum dots can be applied in different environments. As described above, the present invention provides new quantum dots having cores and shells with a gradual composition gradient, which can be applied to not only Group II-IV semiconductor quantum dots but also other semi-conductor quantum dots, such as Group II-V semiconductor quantum dots and Group IV-IV semiconductor quantum dots, and can be utilized in the development of semi-conductor quantum dots having different physical properties and in various other fields.

MODE FOR THE INVENTION

Hereinafter, exemplary embodiments of the present invention will be described in detail.

Figure 1:
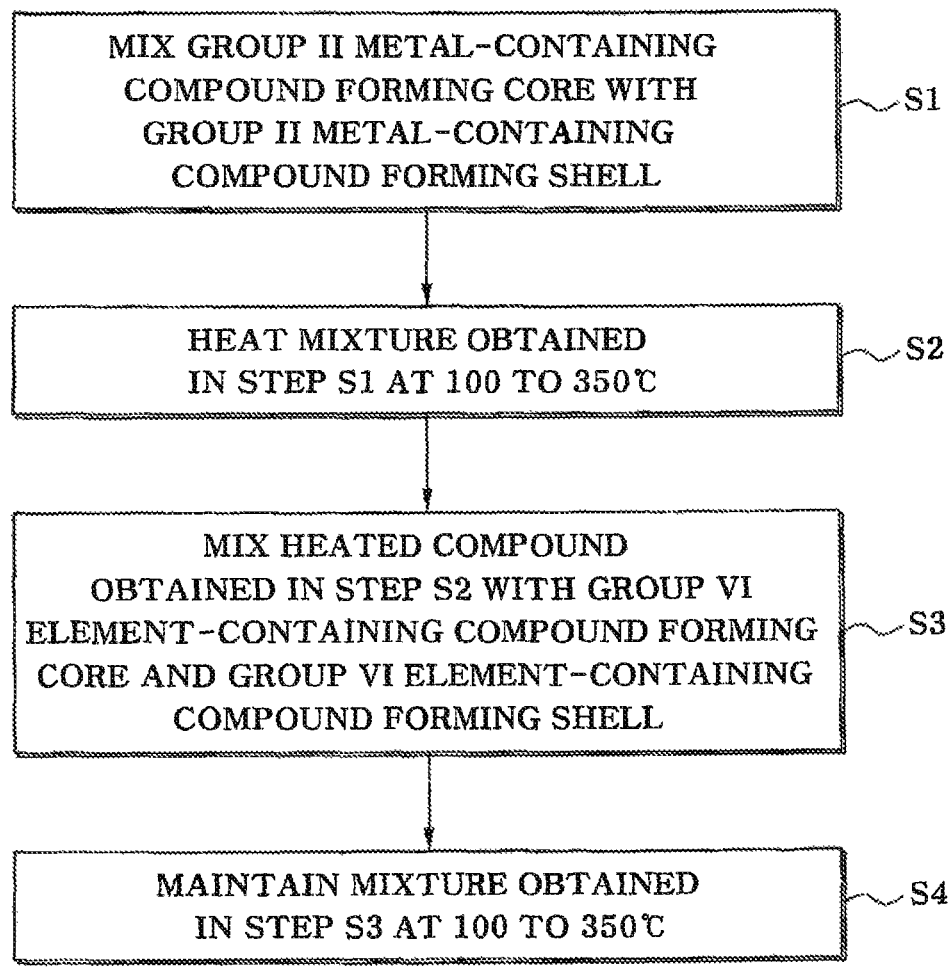
FIG. 1 is a flowchart illustrating a process of manufacturing quantum dots according to an exemplary embodiment of the present invention.

The present invention provides quantum dots having a gradual composition gradient and high luminous efficiency and a method of manufacturing the quantum dots in a short amount of time at low cost. FIG. 1 is a flowchart illustrating a process of manufacturing quantum dots according to an exemplary embodiment of the present invention.

A method of manufacturing quantum dots according to the present invention includes mixing a Group II metal-containing compound forming the core of a quantum dot and a Group II metal-containing compound forming the shell of the quantum dot, and heating the mixture in step S1.

In the present invention, the Group II metal used in step S1 may be one selected from the group consisting of cadmium (Cd), zinc (Zn), and mercury (Hg), and the Group II metal-containing compound may be one selected from the group consisting of cadmium oxide, zinc acetate, cadmium acetate, cadmium chloride, zinc chloride, zinc oxide, mercury chloride, mercury oxide, and mercury acetate. However, the present inventions not limited thereto and any compound containing a Group II metal such as cadmium, zinc, or mercury can be used.

The two compounds are mixed using an organic solvent. The organic solvent may be one selected from the group consisting of 1-oxadecen, hexadeeylamine (HDA), trioctylamine (TOA), triociylphosphme oxide, oleic acid, and oleyl amine, but the present invention is not limited thereto.

In addition to the organic solvent fatty acid may be added when mixing the two compounds. The fatty acid may be one selected from the group consisting of oleic acid, stearic acid, myristic acid, lauric acid, palmitic acid, elaidicacid, eicosanoic acid, heneicosanoic acid, tricosanoic acid, docosanoic acid, tetracosanoic acid, hexacosanoic acid, heptacosanoic acid, octacosanoic acid, and cis-13-docosenoic acid. However, the present invention is not limited thereto and any fatty acid may be used.

In the present invention, in step S1, the mixture of the Group II metal-containing compound forming the core and the Group II metal-containing compound forming the shell is heated in an atmosphere of $N_2$ or Ar, at no more than atmospheric pressure, at a temperature of about 100 to 350° C., for 10 to 600 minutes. When the mixture of the two compounds is heated under these conditions, a metal-fatty acid complex is formed. The metal-fatty acid complex is uniformly distributed in the solvent. Since the mixture of the Group II metal-containing compounds may react with oxygen, the heating process may be performed in the nonreactive $N_2$ or Ar atmosphere at atmospheric pressure to suppress reactivity. Also, when the heating process is performed at a temperature lower than 100° C., a complex is not formed, and when the heating process is performed at a temperature higher than 350° C., an organic compound may boil and evaporate or be broken. Therefore, the heating process may be performed at a temperature of about 100 to 350° C.

After the metal-fatty acid complex is formed, the remaining oxygen and water, and impurities with a low boiling point are removed in a vacuum using a liquid nitrogen trap, and the metal-unsaturated fatty acid complex is heated in an $N_2$ or Ar atmosphere at atmospheric pressure and a temperature of about 100 to 350° C. in step S2. When the heating process is performed at a temperature lower than 100° C., forming quantum dots is difficult, and when the heating process is performed at a temperature higher than 350° C., an organic compound may boil and evaporate or be broken. Therefore, the heating process may be performed at a temperature of about 100 to 350° C.

In step S1, the Group II metal-containing compound forming the core may be mixed with the Group II metal-containing compound forming the shell in a 1:1 to 1:50 molar ratio. When the molar ratio is less than 1:1, quantum dots that emit long-wavelength light are formed. When the molar ratio is more than 1:50, quantum dots that emit short-wavelength light are formed and a slowly reacting material may form the core. By adjusting the molar ratio, the wavelength range of formed quantum dots may be controlled.

Thereafter, in step S3, the heated compound obtained in step S2 is mixed with a Group VI element-containing compound forming the core and a Group VI element-containing compound forming the shell.

The Group VI element may be one selected from the group consisting of sulfur (S), selenium (Se), tellurium (Te), and polonium (Po), and the Group VI element-containing compound may be one selected from the group consisting of trioctylphosphine selenide, trioctylphosphine sulfide trioctylphosphine telluride, trioctylphosphine polonide, tributylephosphine selenide, tributylephosphine sulfide, tributylephosphine telluride, and tributylephosphine polonide. However, the present invention is not limited thereto and any material containing a Group VI element such as sulfur, selenium, tellurium, and polonium may be used. In step S3, the Group VI element-containing compound forming the core may be mixed with the Group VI element-containing compound forming the shell in a 1:1 to 1:50 molar ratio. When a molar ratio is less than 1:1, quantum dots that emit long-wavelength light are formed. When the molar ratio is more than 1:50, quantum dots that emit short-wavelength light are formed and a slowly reacting material may form the core. Specifically, although the compound forming the core reacts rapidly and is formed earlier, when there is too much compound forming the shell, part of the compound does not form the shell and may form an additional core structure.

As described above, when fee Group VI element-containing compounds are added to the heated mixture, rapidly reacting Group II metal and Group VI element are separated earlier in a supersaturated state in a reactor containing the mixture to generate a nucleation reaction for forming the core. In this case, similar nucleation reactions are facilitated at the same time, thereby generating quantum-dot cores with a uniform size.

After adding and reacting the Group VI element-containing compounds, the mixture obtained in step S3 is maintained at a temperature of 100 to 350° C. in step S4. When a continuous reaction is induced by maintaining the temperature, the Group II metal and Group VI element, which form the cores on the surface of the quantum-dot cores, react and grow along with the Group II metal and Group VI element, which form the shells. After 10 minutes, reaction between rapidly reacting Group II metal and Group VI element ends, while slowly reacting Group II metal and Group VI element continue to react to form the shells.

The quantum dots manufactured according to the above-described method of the present invention have Group II-VI compound cores and Group II-VI compound shells. The Group II-VI compound forming the shells has a larger bandgap than the Group II-VI compound forming the cores, and the Group II-VI compound shells have a gradual composition gradient.

Figure 2:
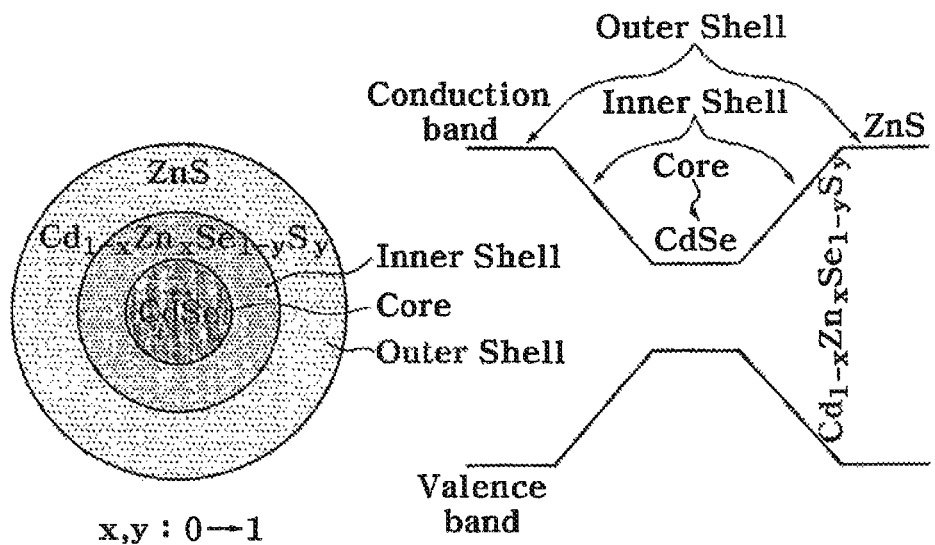
FIG. 2 is a diagram of a composition gradient and energy band of a quantum dot having a gradual composition gradient shell structure according to an exemplary embodiment of the present invention.

Specifically, as shown in FIG. 2, the quantum dots manufactured according to the present invention have shell structures with a gradual composition gradient, so that they have the lowest conductance-band edge and the highest covalence-band edge, in the cores. The conductance-band edge becomes gradually higher and the covalence-band edge becomes gradually lower from an inner portion of the shell toward an outer portion of the shell, so that the outermost portion of the shell has the highest conductance-band edge and the lowest covalence-band edge.

More specifically, me quantum dot manufactured according to the present invention is divided into the core and the shell, and the shell is divided into an inner shell and an outer shell. As illustrated in FIG. 2, the core may be formed of CdSe, the outer shell may be formed of ZnS, and the inner shell may be formed of $Cd_{1-X}Zn_XSe_{1-Y}S_Y$ ($0<X<1$, $0<Y<1$, X and Y become smaller from the outer shell toward the core). The inner shell surrounds the core and is surrounded by the outer shell. Each of the core and the outer shell is formed of a compound semiconductor with a predetermined composition ratio, while the inner shell is formed of a compound semiconductor whose composition ratio varies with position. The core has a small bandgap energy, and the outer shell has a larger bandgap energy than the core. Also, the inner shell has a bandgap energy that becomes smaller from the outer shell toward the core.

In the quantum dot described above, formation of the core is followed by formation of the shell having a composition gradient. Therefore, even if the shell is formed to a large thickness, the lattice mismatch between core and shell does not occur unlike in conventional core-shell quantum dots, Furthermore, since the quantum dots according to the present invention are based on the funnel concept, electrons and holes generated in the shell are transferred to the core to emit light, so that the quantum dots have a high luminous efficiency of about 80% or higher.

The present invention will now be described more explicitly hereinafter with reference to the accompanying drawings, in which exemplary embodiments of the invention are shown. This invention may, however, be embodied in different forms and should not be construed as limited to the exemplary embodiments set forth herein.

Figure 3:
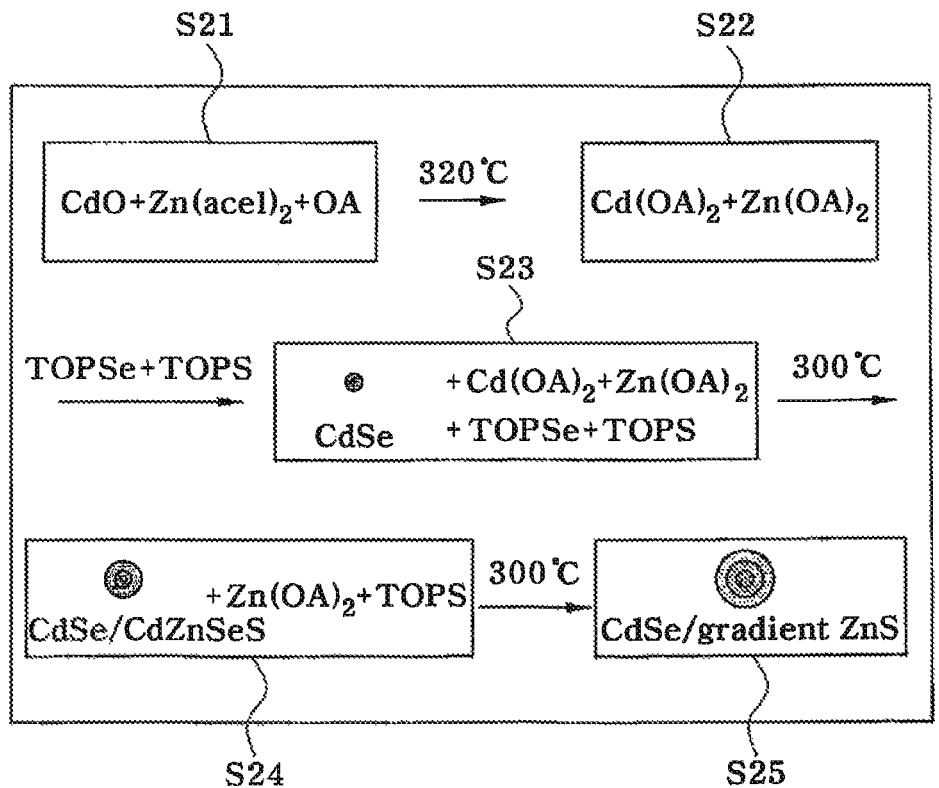
FIG. 3 is a diagram illustrating a process of manufacturing quantum dots according to an exemplary embodiment of the present invention.
Figure 4:
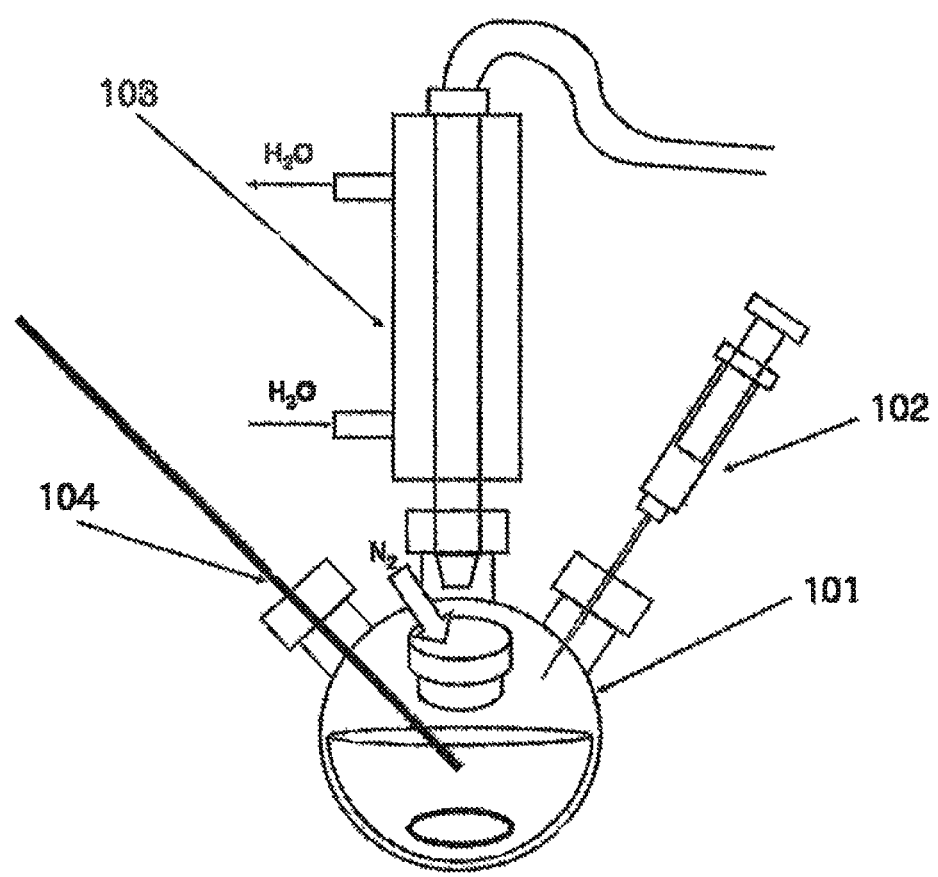
FIG. 4 is a diagram of experimental equipment used for manufacturing quantum dots according to the present invention.

Exemplary Embodiment 1: Synthesis of Quantum Dots with CdSe Cores and ZnS Shells FIG. 3 is a diagram illustrating a process of manufacturing quantum dots according to an exemplary embodiment of the present invention, and FIG. 4 is a diagram of experimental equipment used for manufacturing quantum dots according to the present invention. Hereinafter, a process of synthesizing quantum dots with CdSe cores and ZnS shells will be described with reference to FIGS. 3 and 4, In step S21, 0.0512 g (0.4 mmol) of solid cadmium oxide (purity: 99.998%), 0.732 g (4 mmol) of zinc acetate, 4.4 ml (17.6 mmol) of oleic acid, and 13.6 ml of 1-octadecene ($CH_2=CH(CH_2)15CH_3$)were put in a 100 ml round-bottom flask 101 including a syringe 101, a thermometer 104, and a cooler 103. In step S22, the mixture was heated at a pressure of 1 torr and a temperature of about 320° C. for 20 minutes to synthesize a cadmium-oleic acid complex and a zinc-oleic acid complex and remove remaining oxygen from the complexes.

Thereafter, the complexes were heated in an $N_2$ atmosphere at a pressure of 1 atmosphere and a temperature, of about 320° C., and a 2 ml mixture of 0.2 ml of 2M trioctylphosphme selenide solution obtained by dissolving selenium in trioctylphosphine and 1.8 ml of 2M trioctylphosphine sulfide solution obtained by dissolving sulfur in trioctylphosphine was rapidly injected into a reactor 101 heated to a temperature of about 320° C. In this case, rapidly reacting cadmium and selenium are supersaturated and separated in the reactor 101. As a result, a similar nucleation reaction is facilitated, thus generating uniform CdSe nuclei in step S23.

Subsequently, when a continuous reaction was induced by maintaining the reactor 101 at a temperature of about 300° C.,cadmium, selenium, zinc, and sulfur reacted and grew on the surface of the CdSe nuclei in step S24. After a predetermined amount of time elapsed, cadmium and selenium stopped reacting, and only zinc and sulfur reacted to form ZnS shells in step S25. As a result, quantum dots having CdSe cores and ZnS shells with a composition gradient were generated.

After finishing the generation of the quantum dots having the cores and the shells with the composition gradient, the temperature of the reactor 101 was lowered to room temperature, and acetone, was added to precipitate the quantum dots. After that, the quantum dots were separated using a centrifugal separator, cleaned three times using about 20 ml of acetone, and dried in a vacuum, thereby completing manufacture of quantum dots with CdSe cores and ZnS shells.

Exemplary Embodiment 2: Synthesis of Quantum Dots with CdSe Cores and ZnSe Shells In the present exemplary embodiment, quantum dots were manufactured in the same manner as in the first exemplary embodiment except that 2 ml of 2M trioctylphosphine selenide solution was used instead of the mixture of trioctylphosphine selenide and trioctylphosphine sulfide used in the first exemplary embodiment.

Exemplary Embodiment 3: Synthesis of Quantum Dots with CdTe Cores and ZnS Shells In the present exemplary embodiment, quantum dots were manufactured in the same manner as in the first exemplary embodiment except that a 2 ml mixture of 0.2 ml of 2M trioctylphosphine telluridesolution and 1.8 ml of 2M trioctylphosphine sulfide solution was used instead of the mixture of trioctylphosphine selenide and trioctylphosphine sulfide used in the first exemplary embodiment.

Exemplary Embodiment 4: Synthesis of Quantum Dots with CdTe Cores and ZnSe Shells In the present exemplary embodiment, quantum dots were manufactured in the same manner as in the first exemplary embodiment except that a 2 ml mixture of 0.2 ml of 2M trioctylphosphine telluridesolution and 1.8 ml of 2M trioctylphosphine selenide solution was used instead of the mixture of trioctylphosphine selenide and trioctylphosphine sulfide used in the first exemplary embodiment.

Exemplary Embodiment 5: Synthesis of Quantum Dots with CdTe Cores and ZnTe Shells In the present exemplary embodiment, quantum dots were manufactured in the same manner as in the first exemplary embodiment except that 2 ml of 2M trioctylphosphine telluride solution was used instead of the mixture of trioctylphosphine selenide and trioctylphosphine sulfide used in the first exemplary embodiment.

Exemplary Embodiment 6: Synthesis of Quantum Dots with CdTe Cores and CdS Shells In the present exemplary embodiment, quantum dots were manufactured in the same manner as in the first exemplary embodiment except that 0.0512 g (4 mmol) of cadmium oxide, 4 ml (16 mmol) of oleic acid, 14 ml of 1-oetadecene were used instead of 0.0512 g (0.4 mmol) of cadmium oxide, 0.732 g (4 mmol) of zinc acetate, 4.4 ml (17.6 mmol) of oleic acid, 13.6 ml of 1-octadecene used in the first exemplary embodiment. And, a 2 ml mixture of 0.2 ml of 2M trioctylphosphine telluride solution and 1.8 ml of 2M trioctylphosphine sulfide solution was used instead of the mixture of trioctylphosphine selenide and trioctylphosphine sulfide used in the first exemplary embodiment.

Exemplary Embodiment 7: Synthesis of Quantum Dots with CdS Cores and ZnS Shells

In the present exemplary embodiment, quantum dots were manufactured in the same manner as in the first exemplary embodiment except that 2 ml of 2M trioctylphosphine sulfide solution was used instead of the mixture of trioctylphosphine selenide and trioctylphosphine sulfide used in the first exemplary embodiment.

Exemplary Embodiment 8: Synthesis of Quantum Dots with ZnSe Cores and ZnS Shells In the present exemplary embodiment, quantum dots were manufactured in the same manner as in the first exemplary embodiment except that 7.32 g (4 mmol) of zinc acetate, 4 ml (16 mmol) of oleic acid, and 14 ml of 1-octadecene were used instead of 0.0512 g (0.4 mmol) of cadmium oxide, 0.732 g (4 mmoL)of zinc acetate, 4.4 ml (17.6 mmol) of oleic acid, and 13.6 ml of 1-octadecene used in the first exemplary embodiment. And, a 2 ml mixture of 0.2 ml of 2M trioctylphosphine selenide solution and 1.8 ml of 2M trioctylphosphine sulfide solution was used instead of the mixture of trioctylphosphine selenide and trioctylphosphine sulfide used in the first exemplary embodiment.

EXPERIMENTAL EXAMPLE

Analysis of Radial Composition Distribution and Quantum and Luminous Efficiencies of Quantum Dots with CdSe Cores and ZnS Shells In the manufacture of the CdSe cores and ZnS shells with a composition gradient according to the method described in the first exemplary embodiment, at times of 10 seconds, 1 minute, 3 minutes, 5 minutes, and 10 minutes after injecting trioctylphosphine selenide and trioctylphosphine sulfide into the reactor, 0.5 ml of a reactant was extracted using a glass syringe, refined three times, and dispersed in nucleic acid.

Figure 5:
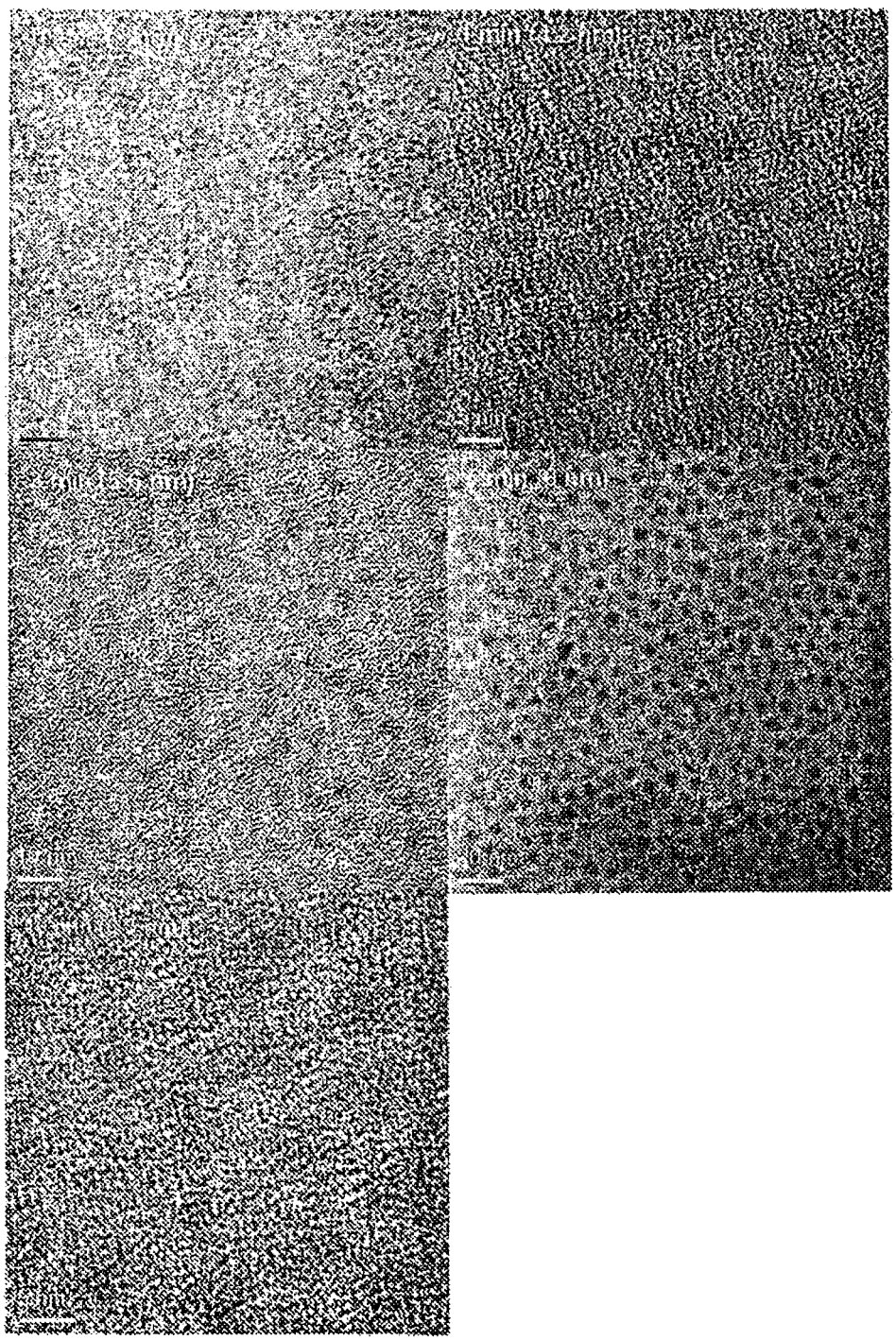
FIG. 5 is a transmission election microscope (TEM) photograph showing changes in quantum dots manufactured according to the present invention as a function of reaction time.
Figure 6:
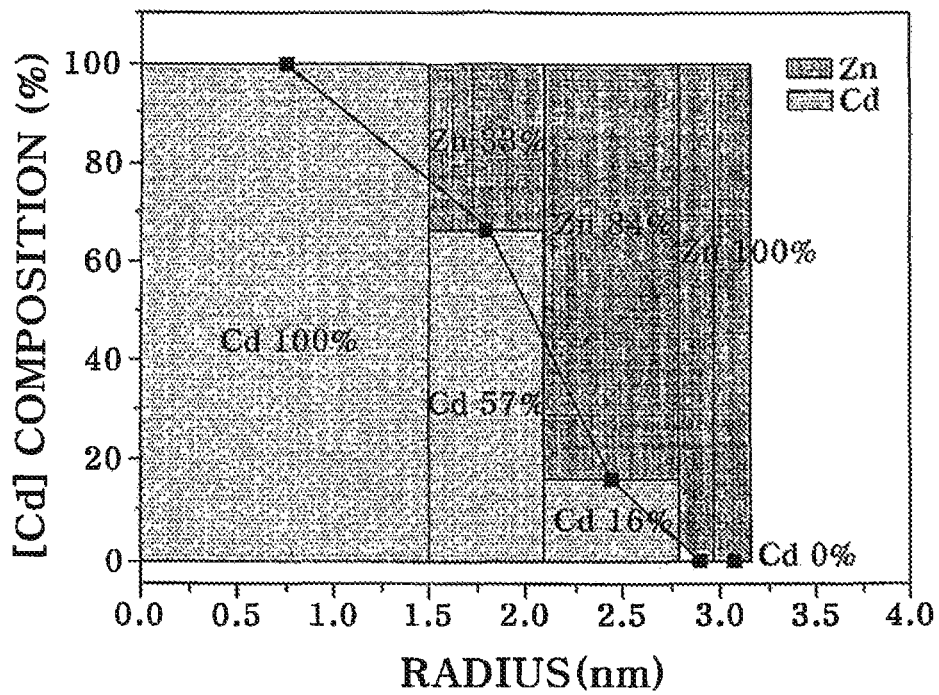
FIG. 6 is a graph showing radial composition distribution of a quantum dot having a core and shell manufactured according to the exemplary embodiment of the present invention.

Each time a sample of quantum dots was extracted on a transmission electron microscope (TEM) grid from Jeol, a TEM analysis was carried out using JEM-3010 from Jeol. FIG. 5 shows the results of the TEM analysis. Also, in order to analyze the composition of each quantum dot, quantum dots were dispersed in 1 ml of nitric acid and 19 ml of water was added to dissolve and ionize the quantum dots. Thus, the com-positions of the quantum dots were analyzed using an ICP-Atomic Emission Spectrometer from Shimadzu, FIG. 6 is a graph showing the distribution of Cd and Zn relative to the TEM results and the radius of the quantum dots, In addition, the luminous efficiency of the quantum dots was measured over time using an Agilent 8454 UV spectrometer from Agilent and an Acton photomultiplier spectrometer from Acton. The light absorptivity and fluorescence intensity of each quantum dot solution was measured using rhodamine 6 G pigment as shown in FIG. 7.

Referring to FIG. 5, the quantum dots grew with time and came to have very uniform globular shapes and a uniform distribution.

Referring to FIG. 6, as the quantum dots grew, cadmium (Cd) mainly reacted to generate the cores. Thereafter, zinc (Zn) started to grow to generate the shells with a gradient, and then Zn mainly grew.

Figure 7:
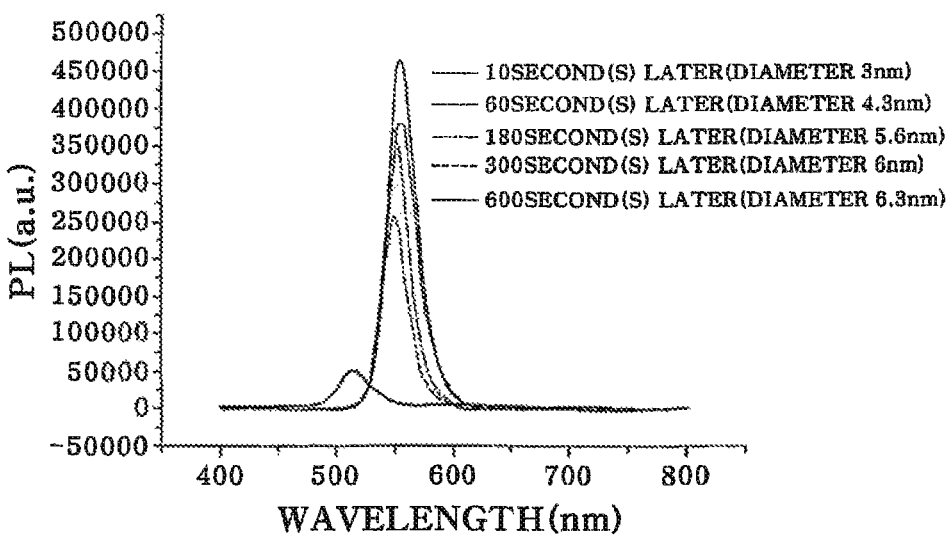
FIG. 7 is a graph showing the luminous efficiency of a quantum dot manufactured according to the present invention as a function of reaction time.

Referring to FIG. 7, it can be confirmed that when the quantum-dot shells with a composition gradient began to form, the luminous efficiency of the quantum dots began to gradually increase. The luminous efficiency reached 80% in 5 minutes after the cores and the shells with a composition gradient began to form.

While the invention has been shown and described with reference to certain exemplary embodiments thereof, it will be understood by one skilled in the art that various changes in form and details may be made therein without departing from the spirit and scope of the invention as defined by the appended claims.

The invention claimed is:

1. A method of manufacturing quantum dots, comprising:
    mixing a compound comprising a core-forming Group II metal with a compound comprising a shell-forming Group II metal to form a mixture;
    heating the mixture comprising the core-forming Group II metal and the shell-forming Group II metal at a temperature between approximately 100° C. and 350 ° C.;
    forming a core by mixing the mixture with a compound comprising a core-forming Group VI element and a compound comprising a shell-forming Group VI element; and
    forming a shell having a composition gradient by maintaining the mixture at a temperature between approximately 100° C. and 350° C.

2. The method according to claim 1, wherein at least one of the core-forming Group II metal and the shell-forming Group II metal comprises at least one of zinc, cadmium, and mercury.

3. The method according to claim 1, wherein heating the mixture occurs:
    in at least one of a $N_2$ atmosphere and a Ar atmosphere;
    at or below atmospheric pressure;
    at the temperature between approximately 100° C. and 350° C.; and
    for a duration between approximately 10 minutes and 600 minutes.

4. The method according to claim 1, wherein the compound comprising the core-forming Group II metal is mixed with the compound comprising the shell-forming Group II metal in a 1:1 molar ratio to 1:50 molar ratio.

5. The method according to claim 1, wherein at least one of the core-forming Group VI element and the shell-forming Group VI element comprises at least one of sulfur, selenium, tellurium, and polonium.

6. The method according to claim 1, wherein the compound comprising the core-forming Group VI element is mixed with the compound comprising the shell-forming Group VI element in a 1:1 molar ratio to 1:50 molar ratio.

* * * * *